(12) United States Patent
Choi et al.

(10) Patent No.: US 6,677,610 B2
(45) Date of Patent: Jan. 13, 2004

(54) LIGHT-EMITTING DEVICE AND DISPLAY APPARATUS USING THE SAME

(75) Inventors: Byoung-lyong Choi, Seoul (KR); Eun-kyung Lee, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/122,219

(22) Filed: Apr. 16, 2002

(65) Prior Publication Data

US 2002/0149015 A1 Oct. 17, 2002

(51) Int. Cl.[7] .............................................. H01L 29/04
(52) U.S. Cl. ............................ 257/59; 257/14; 257/72; 257/79; 257/103
(58) Field of Search ........................... 257/13–14, 59, 257/79–103, 72, 449–457, 918, 749

(56) References Cited

U.S. PATENT DOCUMENTS 5,105,236 A * 4/1992 Hayakawa ................... 257/88
5,156,979 A * 10/1992 Sato et al. .................... 438/56
5,412,226 A * 5/1995 Rejman-Greene et al. .... 257/21
5,600,157 A * 2/1997 Abiko et al. .................. 257/84
6,157,047 A * 12/2000 Fujita et al. .................. 257/51
2002/0153845 A1 * 10/2002 Lee et al. .................. 315/169.3

* cited by examiner

*Primary Examiner*—David Nelms
*Assistant Examiner*—Andy Huynh
(74) *Attorney, Agent, or Firm*—Staas & Halsey LLP

(57) ABSTRACT

A light-emitting device and a display apparatus using the light-emitting device. The light-emitting device includes a p-type or n-type substrate, at least one doped region formed on at least one surface of the substrate while being doped with a predetermined dopant to be an opposite type from that of the substrate to emit light by quantum confinement in a p-n junction between the doped region and the substrate; and an electrode formed such that the light emitted from the p-n junction of the doped region is externally emitted through both surfaces of the substrate. The light-emitting device has a higher light-emitting efficiency than porous silicon-based and nano-crystal silicon-based light-emitting devices and can externally emit the light generated from the p-n junction in two directions. All of the light emitted in two directions can be utilized, thereby maximizing light-emitting efficiency.

38 Claims, 5 Drawing Sheets

Longitudinal QW    Laternal QW

LIGHT-EMITTING DEVICE AND DISPLAY APPARATUS USING THE SAME

CROSS-REFERENCE TO RELATED APPLICATIONS

This application claims the benefit of Korean Application Nos. 01-20495, filed Apr. 17, 2001 and 02-15903, filed Mar. 23, 2002, in the Korean Industrial Property Office, the disclosures of which are incorporated herein by reference.

BACKGROUND OF THE INVENTION

1. Field of the Invention

The present invention relates to a light-emitting device with a structure capable of maximizing light-emitting efficiency, and a display apparatus using the light-emitting device.

2. Description of the Related Art

Silicon semiconductor substrates can be used to highly integrate logic devices, operator devices, and drive devices therein with high reliability. Because silicon is cheap, highly integrated circuits can be formed on a silicon substrate at lower cost, compared to using a compound semiconductor. For this reason, silicon has been used as a base material for most integrated circuits.

Based on the advantage of silicon, steady efforts have been made to manufacture a silicon-based light-emitting device so as to implement a low-cost optoelectronic device that can be manufactured by the general process used to form integrated circuits. It has been experimentally confirmed that porous silicon and nano-crystal silicon have the ability to emit light. Accordingly, research on this idea continues to be conducted.

Figure 1:
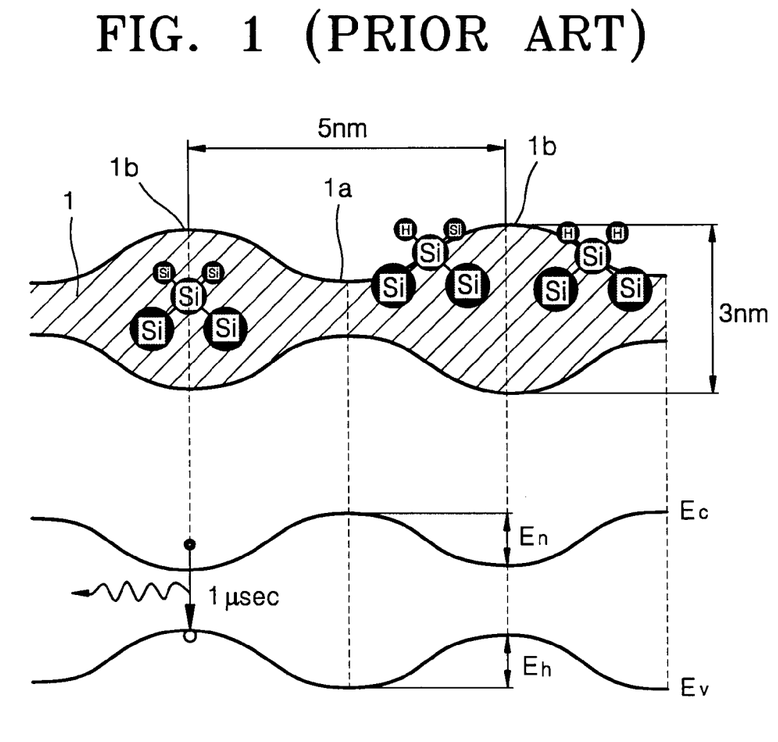
FIG. 1 illustrates a cross-section of a porous silicon region formed in the surface of a bulk monocrystalline silicon and the energy bandgap between the valence band and conduction band in the porous silicon region.

FIG. 1 illustrates a cross-section of a porous silicon region formed in the surface of a bulk monocrystalline silicon and the energy bandgap between the valence band and conduction band in the porous silicon region.

Porous silicon can be attained by anodic electrochemical dissolution on the surface of bulk monocrystalline silicon (Si) in an electrolyte solution containing, for example, a hydrofluoric (HF) acid solution.

While a bulk silicon is subjected to anodic electrochemical dissolution in a HF solution, a porous silicon region 1 having a number of pores 1a is formed in the surface of the bulk silicon, as illustrated in FIG. 1. In the region where the pores 1a are formed, more Si—H bonds exist than in a projection region 1b, which is not dissolved by hydrofluoric acid. The energy bandgap between the valence band (Ev) and the conduction band (Ec) appears to be inversed with respect to the shape of the porous silicon region 1.

A recession region in the energy bandgap curve, which is surrounded by projection regions and corresponds to the projection region 1b surrounded by the pore region 1a in the porous silicon region 1, provides a quantum confinement effect so that the energy bandgap in this region is increased over that of the bulk silicon. Also, in this region, holes and electrons are trapped, emitting light.

For example, in the porous silicon region 1, the projection region 1b surrounded by the pore region 1a is formed as a quantum wire of monocrystalline silicon to provide the quantum confinement effect, electrons and holes are trapped by the quantum wire and coupled to emit light. The wavelengths of emitted light can range from a near infrared wavelength to a blue wavelength according to the dimension (width and length) of the quantum wire. Here, the period of the pores region 1a is, for example, about 5 nm, and the porous silicon region 1 has a maximum thickness of, for example, 3 nm, as illsutrated in FIG. 1.

Therefore, after manufacturing a porous silicon-based light-emitting device, as a predetermined voltage is applied to the light-emitting device where the porous silicon region 1 is formed, a desired wavelength of light can be emitted depending on the porosity of the porous silicon region 1.

However, such a porous silicon-based light-emitting device as described above is not highly reliable yet as a light-emitting device and has an external quantum efficiency (EQE) as low as 0.1%.

Figure 2:
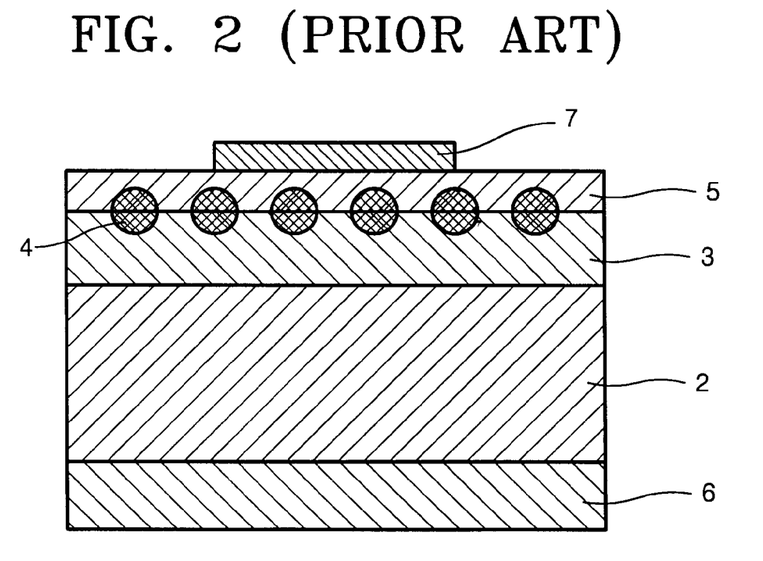
FIG. 2 is a sectional view of an example of a nano-crystal silicon-based light-emitting device.

FIG. 2 is a sectional view of an example of a nano-crystal silicon-based light-emitting device. Referring to FIG. 2, the nano-crystal silicon-based light-emitting device has a layered structure including a p-type monocrystalline silicon substrate 2, an amorphous silicon layer 3 formed on the silicon substrate 2, an insulating layer 5 formed on the amorphous silicon layer 3, and lower and upper electrodes 6 and 7 formed on the bottom of the silicon substrate 2 and the top of the insulating layer 5, respectively. A nano-crystal silicon 4 is formed as a quantum dot in the amorphous silicon layer 3.

The nano-crystal silicon 4 is formed in a quantum dot form as the amorphous silicon layer 3 is rapidly heated to 700° C. in an oxygen atmosphere for recrystallization. Here, the amorphous silicon layer 3 has a thickness of 3 nm, and the nano-crystal silicon 4 has a size of about 2–3 nm.

In the light-emitting device using the nano-crystal silicon 4 described above, as a reverse bias voltage is applied across the upper and lower electrodes 7 and 6, an intensive electric field is generated at the ends of the amorphous silicon layer 3 between the silicon substrate 2 and the nano-crystal silicon 4 so that electrons and holes in the state of high-energy level are generated. The electrons and holes are tunneled into the nano-crystal silicon 4 and couple to each other therein to emit light. In the nano-crystal silicon-based light-emitting device, the wavelength of light generated therefrom becomes shorter as the size of the nano-crystal silicon quantum dot decreases.

In the light-emitting device using the nano-crystal silicon 4 described above, it is difficult to control the size and uniformity of the nano-crystal silicon quantum dot, and efficiency is very low.

SUMMARY OF THE INVENTION

Accordingly, it is an object of the present invention to provide a light-emitting device having a light-emitting efficiency higher than porous silicon-based and nano-crystal silicon-based light-emitting devices and having a double-sided light-emitting structure to maximize light-emitting efficiency, and a display apparatus using the light-emitting device.

Additional objects and advantages of the invention will be set forth in part in the description which follows and, in part, will be obvious from the description, or may be learned by practice of the invention.

The foregoing and other objects of the present invention are achieved by providing a light-emitting device comprising: a p-type or n-type substrate; at least one doped region formed on at least one surface of the substrate while being doped with a predetermined dopant to be an opposite type from that of the substrate to emit light by quantum confinement in a p-n junction between the doped region and the substrate; and an electrode formed such that the light emitted from the p-n junction of the doped region is externally emitted through both surfaces of the substrate.

The doped region may be formed on one surface of the substrate, and the electrode comprises first and second electrodes formed on a first surface and a second surface of the substrate, respectively, such that the light emitted from the p-n junction of the doped region can be emitted through both first and second surfaces of the substrate. In this case, at least one of the first and second electrodes can be formed as a transparent electrode.

Further, the doped region may comprise first and second doped regions formed on the first surface and the second surface of the substrate, respectively, and the electrode comprises first and second electrodes formed on the first surface and the second surface of the substrate, respectively, to emit light from the p-n junction of the first doped region and third and fourth electrodes formed on the second surface and the first surface of the substrate, respectively, to emit light from the p-n junction of the second doped region, the first and fourth electrodes formed on the first surface of the substrate being separated from each other, and the second and third electrodes formed on the second surface of the substrate being separated from each other.

Further, the substrate may comprise first and second substrates, the doped region may comprise first and second doped regions formed on an outer surface of the respective first and second substrates, and the electrode may comprise first and second electrodes formed on the outer surface of the respective first and second substrates and a common electrode formed between the first and second substrates.

Further, the light-emitting device may comprise a control layer that is formed on the same surface of the substrate as the doped region, acts as a mask in forming the doped region, and limits the depth of the doped region to be ultra-shallow. Further, the substrate may be formed of a predetermined semiconductor material including silicon, and the control layer may be a silicon oxide layer of an appropriate thickness such that the doped region can be formed to the ultra-shallow depth.

The foregoing and other objects of the present invention may also achieved by providing a display apparatus having a plurality of light-emitting devices and enabling bi-directional display, each of the plurality of light-emitting devices comprising: a p-type or n-type substrate; at least one doped region formed on at least one surface of the substrate while being doped with a predetermined dopant to be an opposite type from that of the substrate to emit light by quantum confinement in a p-n junction between the doped region and the substrate; and an electrode formed such that the light emitted from the p-n junction of the doped region is externally emitted through both surfaces of the substrate.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE INVENTION

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 3:
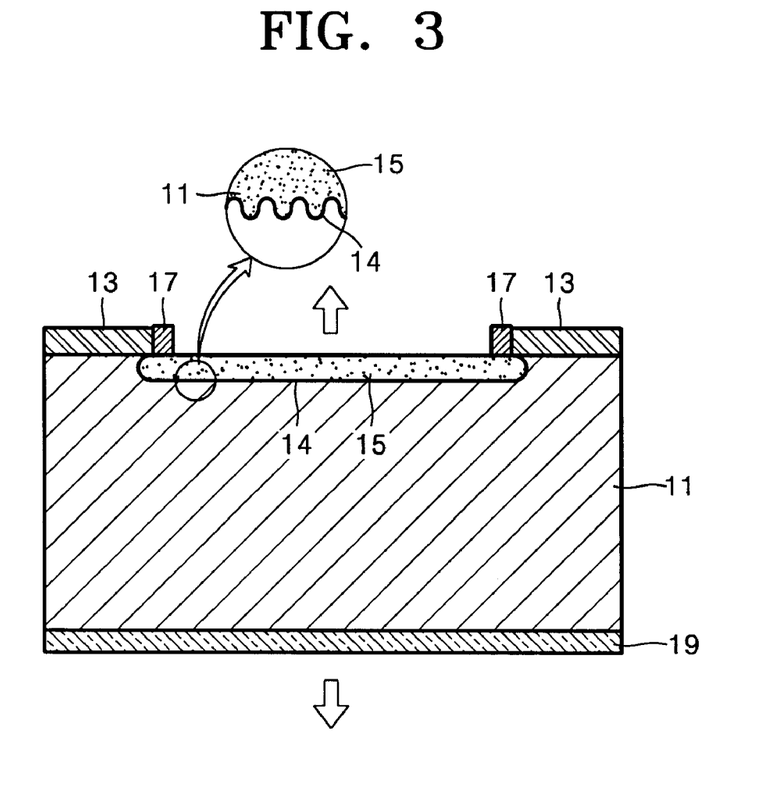
FIG. 3 is a sectional view of an embodiment of a light-emitting device according to the present invention.

Referring to FIG. 3, a light-emitting device according to the present invention includes a substrate 11, at least one doped region 15 formed in at least one surface of the substrate 11 while being doped with a predetermined dopant to be an opposite type from that of the substrate 11 so that light emission occurs by a quantum confinement effect in a p-n junction 14 adjacent to the substrate 11, and an electrode structure that is designed to generate light in the p-n junction 14 of the doped region 15 and externally emit the generated light through both sides of the substrate 11. The light-emitting device according to the present invention further includes a control layer 13 on the surface of the substrate 11 where the doped region 15 is formed, to act as a mask in forming the doped region 15 and to limit the depth of the doped region 15 to an ultra-shallow depth. The control layer 13 is necessary to form the doped region 15 of the light-emitting device according to the present invention and can be selectively removed after the formation of the doped region 15.

Preferably, the substrate 11 is formed of a predetermined semiconductor material including silicon, for example, silicon, silicon carbide, or diamond. Preferably, the substrate 11 is doped with an n-type dopant.

The doped region 15 is formed by diffusing a predetermined dopant, for example, boron or phosphorous, into the substrate 11 through an aperture in the control layer 13. The doped region 15 is doped with an opposite type to the substrate 11, for example, a $p^+$-type.

In doping the doped region 15, it is preferable that the doped region 15 is doped to an ultra-shallow depth such that at least one of a quantum well, a quantum dot, and a quantum wire is formed between the doped region 15 and the substrate 11, i.e., in the p-n junction 14, emits light due to a quantum confinement effect.

A quantum well is mostly formed in the p-n junction 14, but a quantum dot or quantum wire can be formed in the p-n junction 14. At least two of the quantum well, quantum dot, and quantum wire may be formed together in the p-n junction 14. Hereinafter, the present invention will be described assuming that a quantum well is formed in the p-n junction 14 for the purpose of simplicity. Although the present invention is described below such that a quantum well is formed in the p-n junction 14, it is appreciated that the quantum well can be regarded as at least one of the quantum well, the quantum dot, and the quantum wire.

Figure 4A:
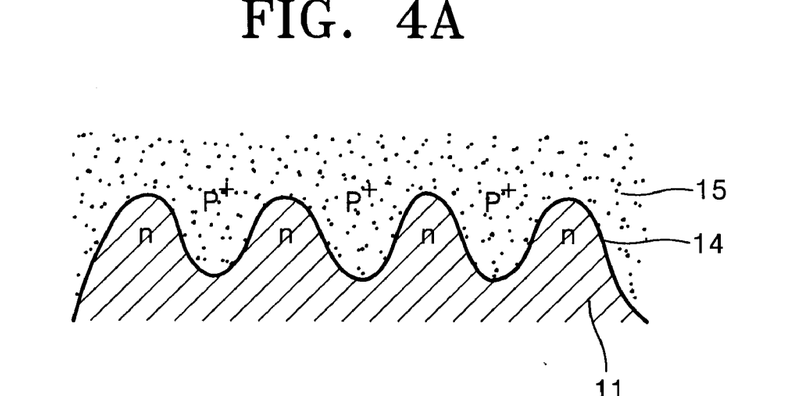
FIG. 4A illustrates the structure of a p-n junction as a doped layer formed to an ultra-shallow depth by non-equilibrium diffusion.
Figure 4B:
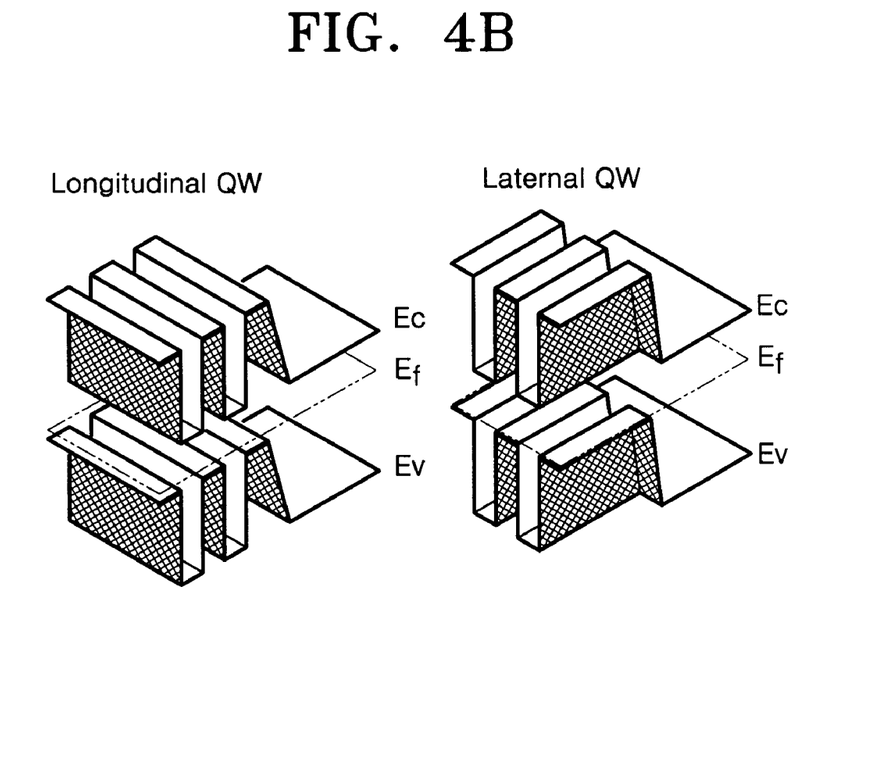
FIG. 4B shows the energy bands of longitudinal and lateral quantum wells (QW) formed in the p-n junction of FIG. 4A by non-equilibrium diffusion.

FIG. 4A illustrates the structure of the p-n junction 14 as the doped layer 15 is formed to an ultra-shallow depth by non-equilibrium diffusion. FIG. 4B illustrates the energy bands of longitudinal and lateral quantum (QW) wells formed in the p-n junction 14 of FIG. 4A by non-equilibrium diffusion. In FIG. 4B, Ec denotes the conduction band energy level, Ev denotes the valence band energy level, and Ef denotes the Fermi energy level. These energy levels are well known in the semiconductor related field, and thus descriptions thereof will be omitted here.

As illustrated in FIGS. 4A and 4B, near the p-n junction 14, doped layers of different dopant types are alternately formed to provide a quantum well structure. The quantum well and the underlying barrier have a depth of about 2 nm and 3 nm, respectively.

Ultra-shallow doping to form the quantum well in the p-n junction 14 can be implemented by controlling the thickness of the control layer 13 and the diffusion process conditions to be optimal.

By an appropriate diffusion temperature and the deformed potential on the surface of the substrate 11, the thickness of the diffusion profile can be adjusted to, for example, 10–20 nm, during the diffusion process. As a result, the quantum well system in such an ultra-shallow diffusion profile is formed. The surface of the substrate 11 is deformed by the thickness of the initial control layer and pre-surface treatment, and the deformation becomes serious while processing.

When the substrate 11 is formed of a predetermined semiconductor material including silicon, the control layer 13 is preferably formed of a silicon oxide ($SiO_2$) layer of an appropriate thickness such that the doped layer 15 can be doped to an ultra-shallow depth. As an example, to form the control layer 13, a silicon oxide layer is formed on the substrate 11, and the silicon oxide layer is etched by photolithography to remove an aperture portion for diffusion, thereby resulting in the control layer 13 having a mask structure.

As is known in the field of diffusion technology, if the thickness of the silicon oxide layer is over an appropriate thickness (thousands of angstroms) or if the diffusion temperature is low, the diffusion is affected by vacancy and results in a deep diffusion profile. In contrast, if the thickness of the silicon oxide layer is less than the appropriate thickness, or if the diffusion temperature is high, the diffusion is affected by self-interstitial of silicon and results in a deep diffusion profile. Therefore, by forming the silicon oxide layer to the appropriate thickness at which self-interstitial of silicon and vacancy are generated in almost the same ratio and are coupled to each other so that diffusion of dopants cannot be facilitated, ultra-shallow doping can be achieved. Physical properties related with vacancy and self-interstitial are well known in the field of diffusion technology, and thus detailed descriptions thereof will be omitted.

An embodiment of the light-emitting device according to the present invention has a structure in which the doped region 15 is formed only in one surface of the substrate 11. In this embodiment, the substrate 11 can be doped with a p-type, and the doped region 15 can be doped with an $n^+$-type.

Also in this embodiment of the present invention, the electrode structure includes a first electrode 17 on one surface of the substrate where the doped region 15 is formed and a second electrode 19 on the other surface of the substrate so that light emitted from the p-n junction 14 of the doped region 15 can be externally emitted through both surfaces of the substrate 11.

The first electrode 17 is formed on one surface of the substrate 11 as a non-transparent metal electrode to be electrically connected to the doped region 15. When the first electrode 17 is formed of a non-transparent metal, the first electrode 17 is formed in an aperture of the control layer 17, which is used to form the doped region 15, except for a light output window region. The first electrode 17 is formed after the formation of the doped region 15. Alternatively, the first electrode 17 may be formed to cover the overall doped region 15 using a transparent electrode material such as indium tin oxide (ITO).

The second electrode 19 can be formed as a transparent electrode on the overall surface of the other surface of the substrate 11 using, for example, ITO. Alternatively, the second electrode 19 can be formed of a non-transparent metal. In this case, the second electrode 19 is formed to expose a light output window (not shown), like the first electrode 17 illustrated in FIG. 3.

As a power (current) is applied across the first electrode 17 and the second electrode 19 of the light-emitting device according to the present invention having the structure described above, injected electrons and holes generate light due to the quantum confinement effect in the quantum well. The generated light is externally emitted through both surfaces of the substrate 11, i.e., through the light output window surrounded by the first electrode 17 and the second electrode 19 that is transparent. Here, the intensity and the wavelength of the emitted light depend upon the quantity of the current applied.

Figure 5:
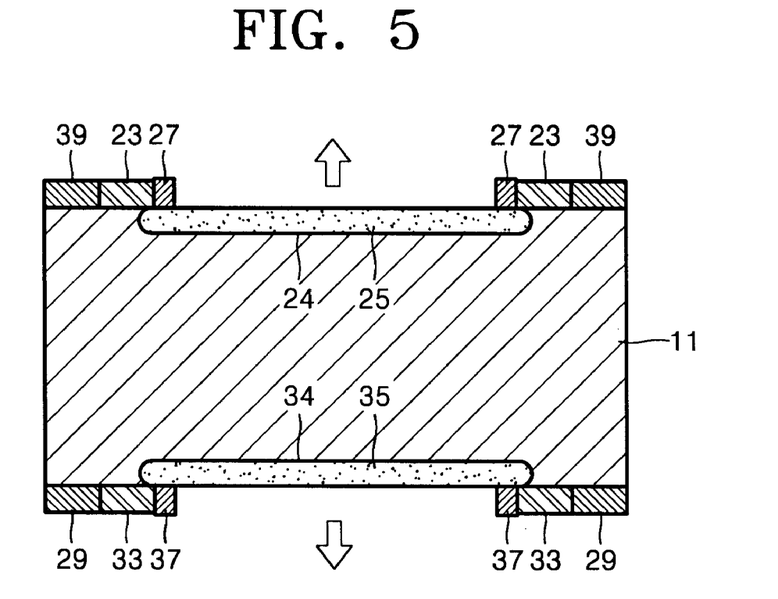
FIG. 5 is a sectional view of another embodiment of the light-emitting device according to the present invention.

Referring to FIG. 5, a light-emitting device according to another embodiment of the present invention can have ultra-shallow first and second doped regions 25 and 35 formed on respective opposite surfaces of the substrate 11, and an electrode structure in which light is generated from respective p-n junctions 24 and 34 of the doped regions 25 and 35 and externally emitted through two surfaces of the substrate 11. In FIG. 5, the same reference numerals as in FIG. 3 denote the elements having the same functions as those in FIG. 3.

For example, the electrode structure in this embodiment of the light-emitting device, as illustrated in FIG. 5, may include first and second electrodes 27 and 29 on a first surface and a second surface of the substrate 11, respectively, to emit light from the p-n junction 24 of the first doped region 25 and third and fourth electrodes 37 and 39 on the second surface and the first surface of the substrate 11, respectively, to emit light from the p-n junction 34 of the second doped region 35.

The first and fourth electrodes 27 and 39 on the first surface of the substrate 11 may be separated from each other so as to be respectively connected to positive and negative terminals of a power source. Likewise, the second and third electrodes 29 and 37 on the second surface of the substrate 11 may be separated from each other so as to be respectively connected to positive and negative terminals of a power source. In this embodiment of the present invention, the first electrode 27 is formed inward of the fourth electrode 39 so as to be electrically connected to the first doped region 25, and the third electrode 37 is formed inward of the second electrode 29 so as to be electrically connected to the second doped region 35. Further, a control layer 23 that limits doping of the first doped region 25 to an ultra-shallow depth is formed between the first and fourth electrodes 27 and 39 on the first surface of the substrate 11, and a control layer 33 that limits doping of the second doped region 35 to an ultra-shallow depth is formed between the second and third electrodes 29 and 37 on the second surface of the substrate 11.

The first and third electrodes 27 and 37 can be formed of non-transparent metals on the first surface and the second surface of the substrate 11, respectively, to expose the respective light output windows such that light generated from the p-n junctions 24 and 34 of the first and second doped regions 25 and 35 is externally output through the respective light output windows. Alternatively, the first and third electrodes 27 and 37 can be formed as transparent electrodes using, for example, ITO, without separate light output windows.

In this embodiment of the present invention having the structure described above, methods of forming the first and second doped regions 25 and 35, the physical properties of the first and second doped regions 25 and 35, materials for the control layers 23 and 33, and the physical functions of the control layers 23 and 33 are the same as those for the doped region 15 and the control layer 13 described in the previous embodiment according to the present invention, and thus descriptions thereof will not be repeated here.

Figure 6:
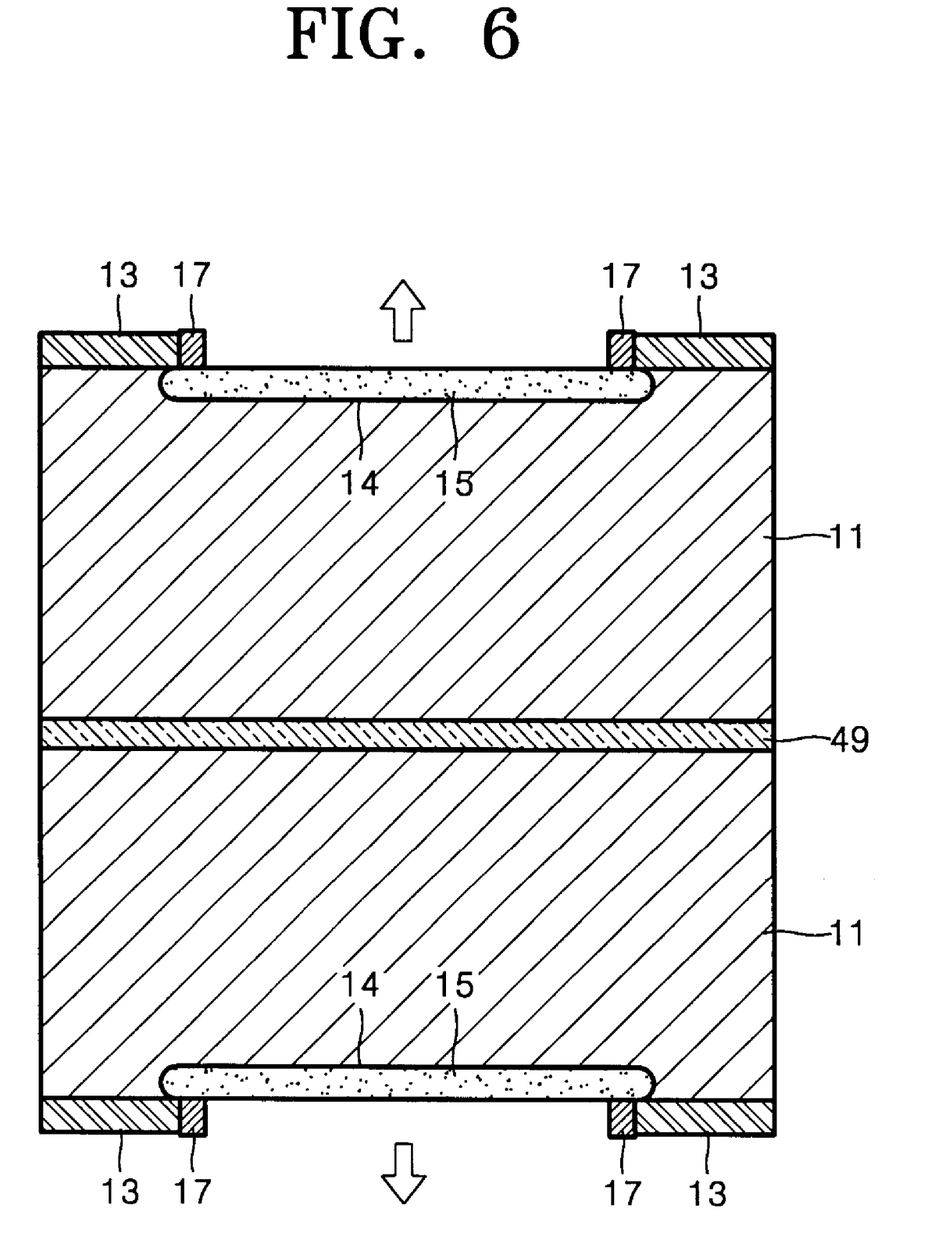
FIG. 6 is a sectional view of yet another embodiment of the light-emitting device according to the present invention.

Referring to FIG. 6, another embodiment of the light-emitting device according to the present invention has a structure in which a pair of basic light-emitting devices, each having a doped region 15 on a first surface of a substrate, are combined together such that a second surface of the respective substrates 11 face each other with a common electrode 49 between the substrates 11. In this embodiment, the common electrode 49 can be formed of a transparent electrode using, for example, ITO. This embodiment of the light-emitting device according to the present invention can be manufactured by combining a pair of light-emitting devices according to the embodiment of FIG. 3 together such that the second electrodes 19 face each other. In this embodiment, the common electrode 49 may be formed of a non-transparent metal.

The light-emitting devices according to each of the embodiments of the present invention described above all have a structure capable of bi-directionally emitting light generated from the p-n junction. Accordingly, all of the light emitted in two directions can be utilized, thereby maximizing light emitting efficiency.

Figure 7:
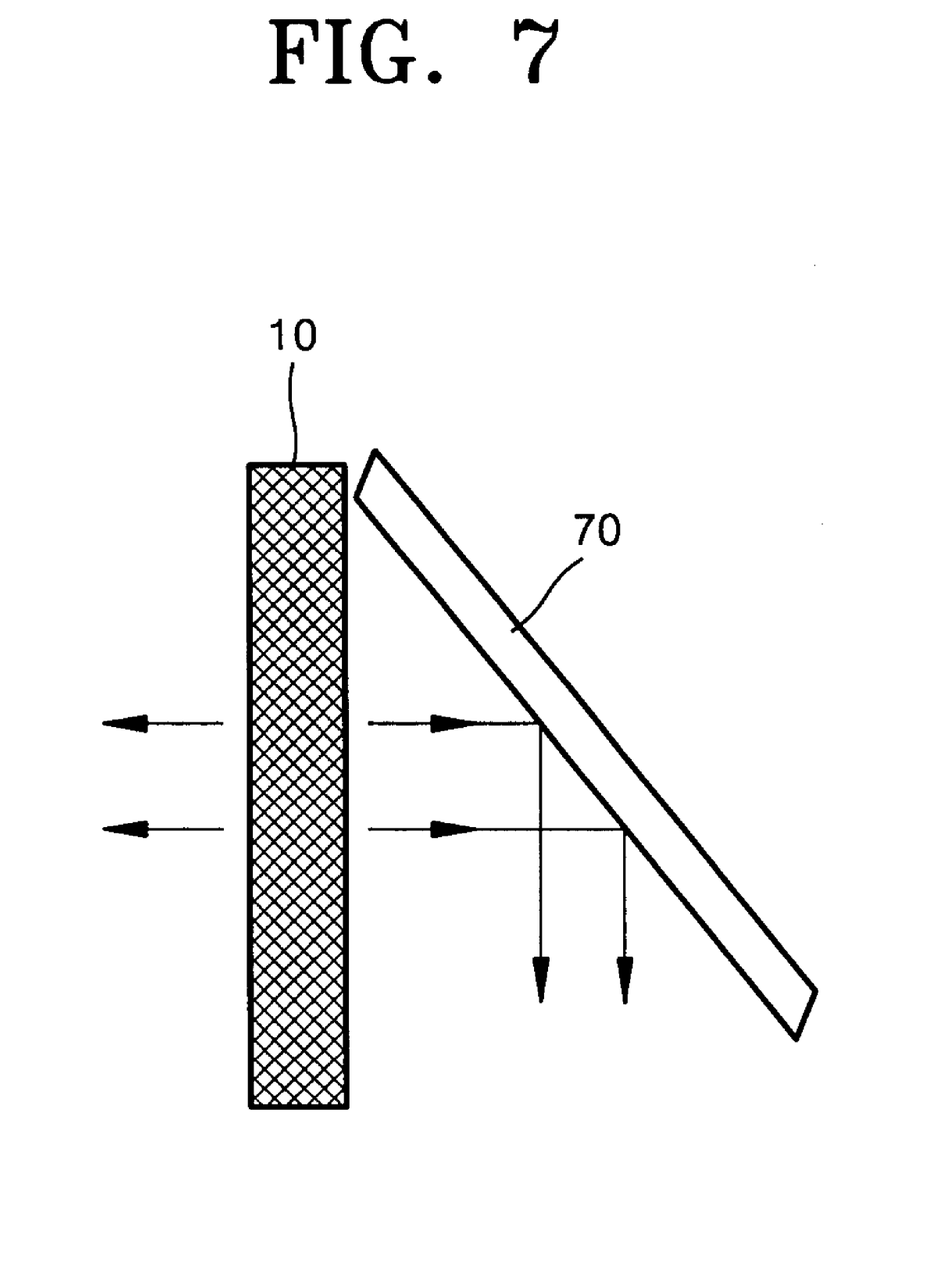
FIG. 7 illustrates a bi-directional display apparatus to which a light-emitting device according to the present invention is applied.

A light-emitting device according to the present invention described above can be applied as a light-emitting device for a display apparatus. As illustrated in FIG. 7, the display apparatus using light-emitting devices according to any of the embodiments of the present invention as a light-emitting device 10 can perform bi-directional display. In this case, the light-emitting device 10 comprises a plurality of light-emitting devices according to the present invention. The display apparatus may further comprise at least one reflection mirror 70 that changes a path of light emitted through the rear surface of the light-emitting device toward a desired direction. A light-emitting device according to the present invention can be manufactured to be much smaller in size using a semiconductor material through the process applied to manufacture semiconductor devices. Accordingly, it will be appreciated that by using a 2-dimensional light-emitting device array of a plurality of light-emitting devices according to the embodiments of the present invention, a bi-directional flat panel solid state display apparatus could be implemented.

A light-emitting device according to the embodiments of the present invention can be applied to an illumination system. In this case, the illumination system includes at least one light-emitting device according to the present invention to comply with the use of the illumination system and the illuminance requirement thereto.

As described above, the light-emitting devices according to the present invention have an ultra-shallow doped region capable of emitting light by quantum confinement in their p-n junction, and thus they have a higher light-emitting efficiency than porous silicon-based and nano-crystal silicon-based light-emitting devices. In addition, the light-emitting devices according to the present invention can externally emit the light generated from the p-n junction in two directions. All of the light emitted in two directions can be utilized, thereby maximizing light-emitting efficiency.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A light-emitting device comprising:
   a p-type or n-type substrate;
   at least one doped region formed on at least one of first and second surfaces of said substrate while being doped with a predetermined dopant to be an opposite type from that of said substrate, to emit light by quantum confinement in a p-n junction between said at least one doped region and said substrate; and
   an electrode structure formed such that the light emitted from the p-n junction of said at least one doped region is externally emitted through both surfaces of said substrate.

2. The light-emitting device according to claim 1, wherein said at least one doped region is formed on the first surface of said substrate, and said electrode structure comprises first and second electrodes formed on said first and second surfaces of said substrate, respectively, such that the light emitted from the p-n junction of said at least one doped region is emitted through said first and second surfaces of said substrate.

3. The light-emitting device according to claim 2, wherein at least one of said first and second electrodes is formed as a transparent electrode.

4. The light-emitting device according to claim 1, wherein:
   said at least one doped region comprises first and second doped regions formed on said first and second surfaces of said substrate, respectively; and
   said electrode comprises:
     first and second electrodes formed on said first and second surfaces of said substrate, respectively, to emit light from the p-n junction of said first doped region, and
     third and fourth electrodes formed on said second surface and said first surface of said substrate, respectively, to emit light from the p-n junction of said second doped region;
   said first and fourth electrodes formed on said first surface of said substrate being separated from each other, and said second and third electrodes formed on said second surface of said substrate being separated from each other.

5. The light-emitting device according to claim 4, wherein said first electrode is formed inward of said fourth electrode, and said third electrode is formed inward of said second electrode.

6. The light-emitting device according to claim 1, wherein said substrate comprises first and second substrates;
said at least one doped region comprises first and second doped regions formed on an outer surface of the respective first and second substrates; and
said electrode comprises:
first and second electrodes formed on the outer surface of said respective first and second substrates; and
a common electrode formed between said first and second substrates.

7. The light-emitting device according to claim 1, further comprising a control layer that is formed on the same surface of said substrate as said at least one doped region, acts as a mask in forming said at least one doped region, and limits the depth of said at least one doped region to be ultra-shallow.

8. The light-emitting device according to claim 2, further comprising a control layer that is formed on the same surface of said substrate as said at least one doped region, acts as a mask in forming said at least one doped region, and limits the depth of said at least one doped region to be ultra-shallow.

9. The light-emitting device according to claim 4, further comprising a control layer that is formed on the same surfaces of said substrate as said first and second doped regions, acts as a mask in forming said first and second doped regions, and limits the depth of said first and second doped regions to be ultra-shallow.

10. The light-emitting device according to claim 6, further comprising a control layer that is formed on the same surface of said substrate as said first and second doped regions, acts as a mask in forming said first and second doped regions, and limits the depth of the doped region to be ultra-shallow.

11. The light-emitting device according to claim 7, wherein said substrate is formed of a predetermined semiconductor material including silicon, and said control layer is a silicon oxide layer of an appropriate thickness such that said at least one doped region can be formed to the ultra-shallow depth.

12. A display apparatus enabling bi-directional display, the display apparatus comprising:
a plurality of light-emitting devices each comprising:
a p-type or n-type substrate;
at least one doped region formed on at least one of first and second surfaces of said substrate while being doped with a predetermined dopant to be an opposite type from that of said substrate to emit light by quantum confinement in a p-n junction between said at least one doped region and said substrate; and
an electrode structure formed such that the light emitted from the p-n junction of said at least one doped region is externally emitted through both surfaces of said substrate.

13. The display apparatus according to claim 12, wherein said at least one doped region is formed on said first surface of said substrate, and said electrode structure comprises first and second electrodes formed on the first surface and second surfaces of said substrate, respectively, such that the light emitted from the p-n junction of said at least one doped region is emitted through both surfaces of said substrate.

14. The display apparatus according to claim 13, wherein at least one of said first and second electrodes is formed as a transparent electrode.

15. The display apparatus according to claim 12, wherein:
said at least one doped region comprises first and second doped regions formed on the first surface and the second surface of said substrate, respectively; and
the electrode comprises:
first and second electrodes formed on the first surface and the second surface of said substrate, respectively, to emit light from the p-n junction of said first doped region, and
third and fourth electrodes formed on the second surface and the first surface of said substrate, respectively, to emit light from the p-n junction of said second doped region,
said first and fourth electrodes formed on the first surface of said substrate being separated from each other, and said second and third electrodes formed on said second surface of said substrate being separated from each other.

16. The display apparatus according to claim 15, wherein said first electrode is formed inward of said fourth electrode, and said third electrode is formed inward of said second electrode.

17. The display apparatus according to claim 12, wherein said substrate comprises first and second substrates;
said at least one doped region comprises first and second doped regions formed on an outer surface of the respective first and second substrates; and
said electrode comprises:
first and second electrodes formed on the outer surface of the respective first and second substrates; and
a common electrode formed between said first and second substrates.

18. The display apparatus according to claim 12, further comprising a control layer that is formed on the same surface of said substrate as said at least one doped region, acts as a mask in forming said at least one doped region, and limits the depth of said at least one doped region to be ultra-shallow.

19. The display apparatus according to claim 13, further comprising a control layer that is formed on the same surface of said substrate as said at least one doped region, acts as a mask in forming said at least one doped region, and limits the depth of said at least one doped region to be ultra-shallow.

20. The display apparatus according to claim 15, further comprising a control layer that is formed on the same surface of said substrate as said at least one doped region, acts as a mask in forming said at least one doped region, and limits the depth of said at least one doped region to be ultra-shallow.

21. The display apparatus according to claim 17, further comprising a control layer that is formed on the same surface of said substrate as said at least one doped region, acts as a mask in forming said at least one doped region, and limits the depth of said at least one doped region to be ultra-shallow.

22. The display apparatus according to claim 18, wherein said substrate is formed of a predetermined semiconductor material including silicon, and said control layer is a silicon oxide layer of an appropriate thickness such that said at least one doped region is formed to the ultra-shallow depth.

23. The display apparatus according to claim 12, wherein said substrate is formed of silicon, silicon carbide, or diamond.

24. The display apparatus according to claim 19, wherein a quantum well is formed between said at least one doped region and said substrate.

25. The display apparatus according to claim 19, wherein a quantum dot is formed between said at least one doped region and said substrate.

26. The display apparatus according to claim 19, wherein a quantum wire is formed between said at least one doped region and said substrate.

27. The display apparatus according to claim 19, wherein at least two of a quantum well, quantum dot and a quantum wire are formed in the p-n junction.

28. The display apparatus according to claim 19, wherein said at least one doped region is formed to an ultra-shallow depth by non-equillibrium diffusion.

29. The light-emitting device according to claim 6, wherein said first electrode is formed after the formation of said at least one doped region.

30. The light-emitting device according to claim 6, wherein said first electrode is formed to cover the overall said at least one doped region and made of a transparent electrode material.

31. The light-emitting device according to claim 30, wherein the transparent material is indium tin oxide (ITO).

32. The light-emitting device according to claim 6, wherein said second electrode is formed as a transparent electrode on the overall second surface of said substrate.

33. The light-emitting device according to claim 32, wherein said second electrode is formed of a non-transparent substrate.

34. The light-emitting device according to claim 33, wherein said control layer comprises a first control layer is formed between said first and fourth electrodes on the first surface of said substrate, and a second control layer is formed between said second and third electrodes on the second surface of said substrate.

35. The light-emitting device according to claim 4, wherein said first and second electrodes are formed of non-transparent metals on the first surface and the second surface of said substrate, respectively, to expose a first output window and a second output window, respectively, such that light generated from the p-n junctions of said first and second doped regions is externally output through respective light output windows.

36. The light-emitting device according to claim 6, wherein said common electrode is formed of a non-transparent metal.

37. The light-emitting device according to claim 6, wherein said common electrode is formed of a transparent metal.

38. The display apparatus according to claim 13, further comprising at least one reflection mirror to change the path of light emitted through a rear surface of said light-emitting device.

* * * * *